United States Patent
Chen

(10) Patent No.: US 9,476,655 B2
(45) Date of Patent: Oct. 25, 2016

(54) THERMAL MODULE

(71) Applicant: Asia Vital Components Co., Ltd., New Taipei (TW)

(72) Inventor: Chih-Peng Chen, New Taipei (TW)

(73) Assignee: Asia Vital Components Co., Ltd., New Taipei (TW)

( * ) Notice: Subject to any disclaimer, the term of this patent is extended or adjusted under 35 U.S.C. 154(b) by 351 days.

(21) Appl. No.: 14/102,860

(22) Filed: Dec. 11, 2013

(65) Prior Publication Data

US 2015/0159966 A1 Jun. 11, 2015

(51) Int. Cl.
*F28F 3/04* (2006.01)

(52) U.S. Cl.
CPC ............... *F28F 3/04* (2013.01); *F28F 3/048* (2013.01); *Y10T 29/4935* (2015.01); *Y10T 29/49366* (2015.01)

(58) Field of Classification Search
CPC ............ F28F 3/04; F28F 3/08; F28F 3/048; Y10T 29/4935; Y10T 29/49366; Y10T 29/49865; Y10T 29/49876
See application file for complete search history.

(56) References Cited

U.S. PATENT DOCUMENTS

| RE20,321 | E | * | 4/1937 | Karmazin | B21D 53/04 |
| | | | | | 29/890.036 |
| 5,761,811 | A | * | 6/1998 | Ito | B23K 1/0012 |
| | | | | | 257/E23.084 |
| 7,762,315 | B2 | * | 7/2010 | Shen | H01L 23/3672 |
| | | | | | 165/80.3 |
| 2009/0321049 | A1 | * | 12/2009 | Chen | H01L 23/3672 |
| | | | | | 165/80.3 |
| 2012/0275162 | A1 | | 11/2012 | Spiro | |
| 2013/0175019 | A1 | * | 7/2013 | Phelan | B23K 20/122 |
| | | | | | 165/185 |

FOREIGN PATENT DOCUMENTS

| TW | 200830676 A | 7/2008 |
| TW | M461300 U | 9/2013 |

* cited by examiner

*Primary Examiner* — Sarang Afzali
(74) *Attorney, Agent, or Firm* — C. G. Mersereau; Nikolai & Mersereau, P.A.

(57) ABSTRACT

A thermal module having an integral body including a base seat with a raised section and a heat dissipation unit with a recess such that the raised section of the base seat fits into the recess of the heat dissipation unit to connect the heat dissipation unit with the base seat. An inner end of the recess is formed with at least one lateral protrusion extended toward an opposite end of the recess and at least one end of the raised section is formed with a groove corresponding to the protrusion, the protrusion being inserted in and connected to the groove.

4 Claims, 7 Drawing Sheets

THERMAL MODULE

BACKGROUND OF THE INVENTION

1. Field of the Invention

The present invention relates generally to a manufacturing method of thermal module, and more particularly to a manufacturing method of thermal module, in which the base seat and the heat dissipation unit are connected with each other by means of thermal expansion/contraction.

2. Description of the Related Art

It is known that the electronic components (such as the central processor) of an electronic device will generate a great amount of heat in working state. The heat will lead to rise of temperature of the electronic components. In case the heat is not properly dissipated, the electronic components will overheat to cause unstable operation or even failure or crash of the entire electronic device. The operation speed of various electronic components has become faster and faster. As a result, the heat generated by the electronic components has become higher and higher. Therefore, it has become a critical issue how to develop more efficient heat sinks applied to various electronic devices.

The conventional heat sinks are generally classified into two types. One is the integrated heat sink, while the other is the radiating fin assembly composed of stacked radiating fins. One side of the radiating fin is bent to form a connection section. The bent section is welded on a base seat to connect the radiating fin with the base seat so as to form the heat sink. Such heat sink is manufactured by means of welding the radiating fins so that the processing is too complicated and fails to meet the current requirement of environmental protection. Therefore, some manufacturers assemble the radiating fins with the base seat by means of insertion to form an insertion-type heat sink. In such heat sink, the radiating fins must be securely inserted with the base seat so that one side of the base seat must be processed to form multiple recesses for inserting the radiating fins into the recesses. This leads to increase of manufacturing cost. Moreover, in some conventional heat sinks, the material of the radiating fins is different from the material of the base seat. When assembled, it is necessary to surface-treat one end of the radiating fin and the base seat for facilitating the connection therebetween. This also complicates the manufacturing process and leads to increase of the manufacturing cost.

According to the above, the conventional heat sink has the following shortcomings:

1. The manufacturing cost is increased.
2. The manufacturing process is time-consuming.

SUMMARY OF THE INVENTION

It is therefore a primary object of the present invention to provide a manufacturing method of thermal module, which can lower the manufacturing cost of the thermal module.

It is a further object of the present invention to provide the above manufacturing method of thermal module, which is speeded and simplified.

To achieve the above and other objects, the manufacturing method of thermal module of the present invention includes steps of: providing a base seat with a raised section and a heat dissipation unit with a recess; heating the heat dissipation unit and fitting the raised section of the base seat into the recess of the heat dissipation unit to connect the heat dissipation unit with the base seat; and tightly connecting the heat dissipation unit with the base seat to form an integrated body after the heat dissipation unit is cooled.

According to the manufacturing method of thermal module of the present invention, the base seat and the heat dissipation unit are connected with each other by means of thermal expansion/contraction. After the heat dissipation unit is cooled, the heat dissipation unit is tightly integrally connected with the base seat. This greatly lowers the manufacturing cost and simplifies the manufacturing process.

The thermal module made by means of the manufacturing method of the present invention includes a base seat and a heat dissipation unit. The base seat has a raised section raised from a middle section of the base seat. The heat dissipation unit includes multiple radiating fins and a recess corresponding to the raised section. The recess is formed on one side of the heat dissipation unit, which side faces the base seat. The raised section is connected to the recess.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1A:
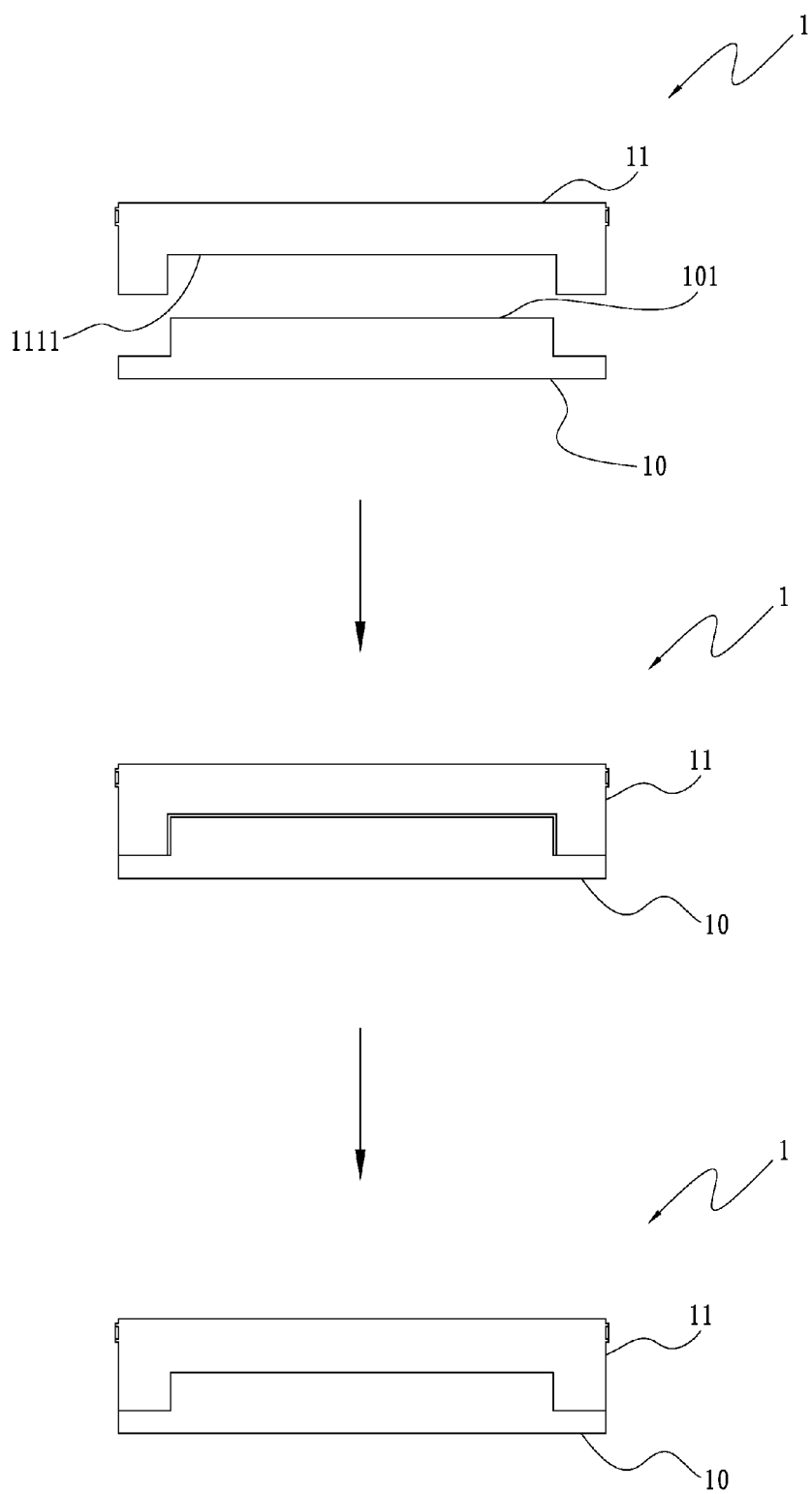
FIG. 1A is a view showing a first embodiment of the manufacturing method of thermal module of the present invention.
Figure 1B:
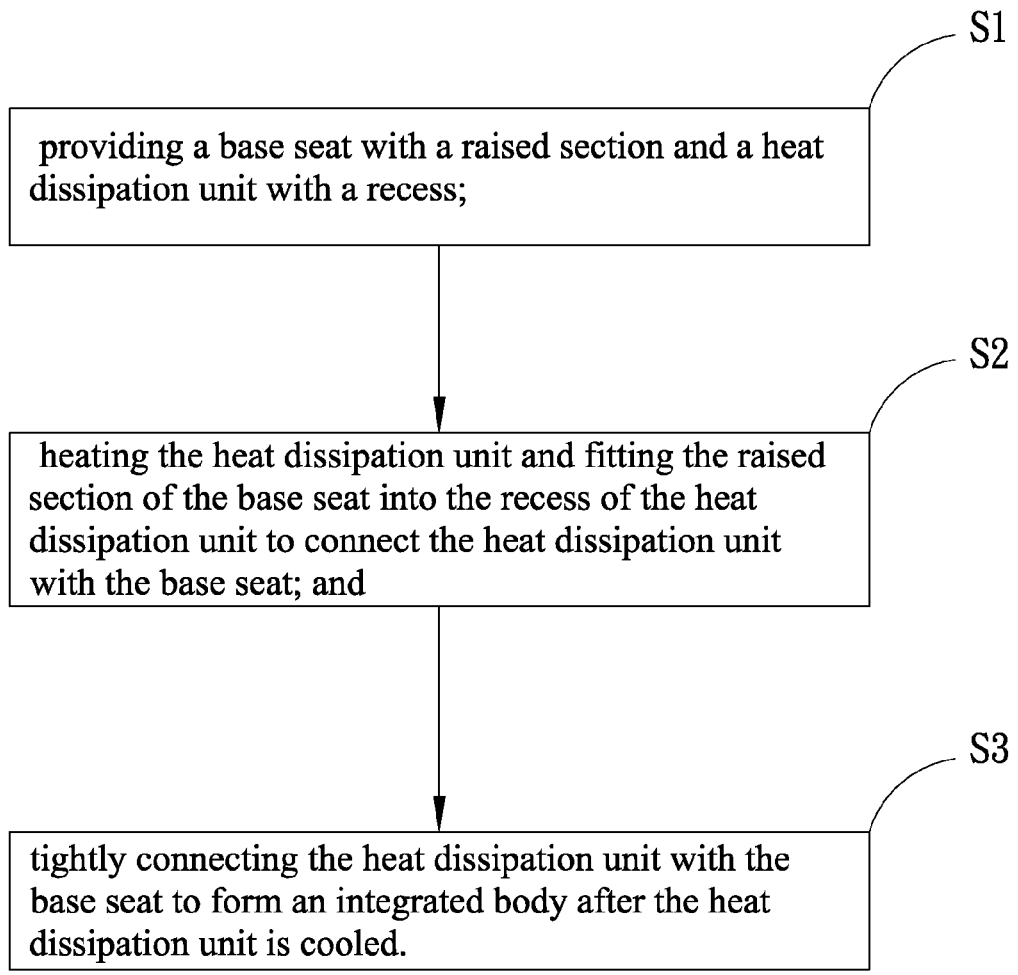
FIG. 1B is a flow chart of the first embodiment of the manufacturing method of thermal module of the present invention.

Please refer to FIGS. 1A and 1B. FIG. 1A is a view showing a first embodiment of the manufacturing method of thermal module of the present invention. FIG. 1B is a flow chart of the first embodiment of the manufacturing method of thermal module of the present invention. According to the first embodiment, the manufacturing method of thermal module of the present invention includes steps of:

S1. providing a base seat with a raised section and a heat dissipation unit with a recess, a base seat 10 and a heat dissipation unit 11 being provided, the base seat 10 having a raised section 101, the heat dissipation unit 11 having a recess 1111;

S2. heating the heat dissipation unit and fitting the raised section of the base seat into the recess of the heat dissipation unit to connect the heat dissipation unit with the base seat, the heat dissipation unit 11 being heated to thermally expand the heat dissipation unit 11, then the raised section 101 of the base seat 10 being fitted into the recess 1111 of the heat dissipation unit 11 to connect the heat dissipation unit 11 with the base seat 10; and S3. tightly connecting the heat dissipation unit with the base seat to form an integrated body after the heat dissipation unit is cooled, the heat dissipation unit 11 being cooled for a period of time, whereby the heat dissipation unit 11 is thermally contracted to tightly and securely connect the heat dissipation unit 11 with the base seat 10 to form an integrated body.

According to the manufacturing method of thermal module of the present invention, the base seat 10 and the heat dissipation unit 11 are connected with each other by means of thermal expansion/contraction. After the heat dissipation unit 11 is cooled, the heat dissipation unit 11 is tightly integrally connected with the base seat 10. This greatly lowers the manufacturing cost. Moreover, it is unnecessary to surface-treat the base seat and one end of the radiating fin for facilitating the connection therebetween as in the conventional manufacturing method. Therefore, the manufacturing process is simplified.

Figure 2A:
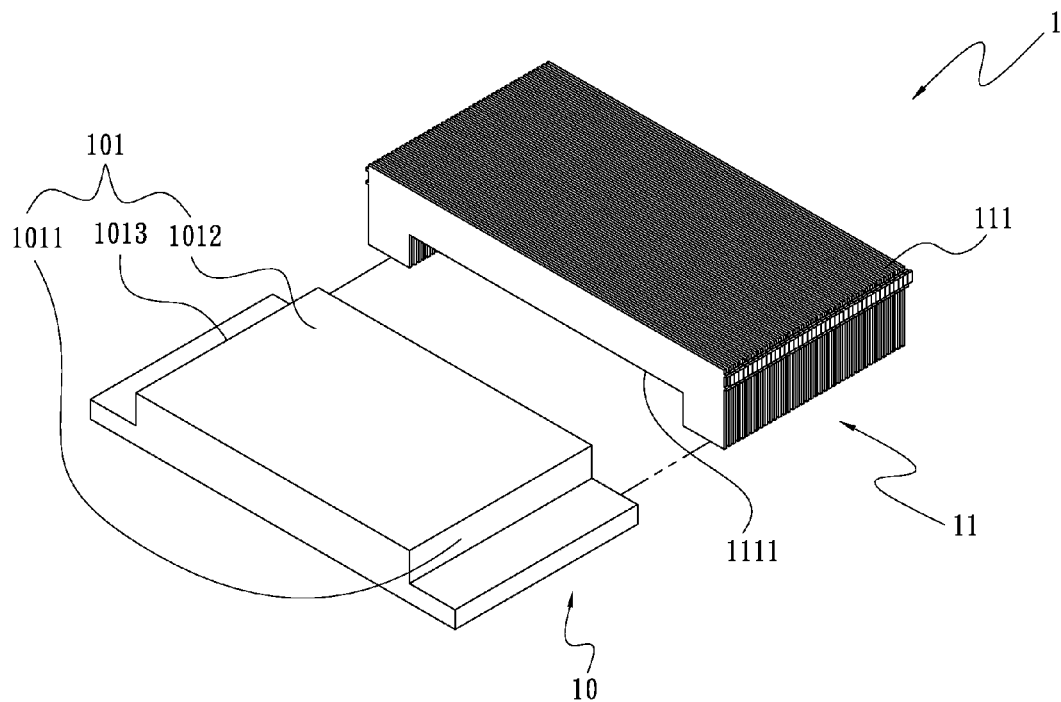
FIG. 2A is a perspective exploded view of a first embodiment of the thermal module of the present invention.
Figure 2B:
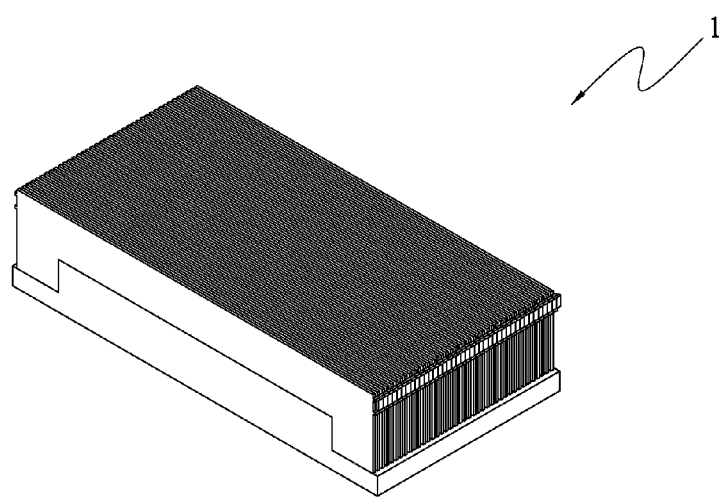
FIG. 2B is a perspective assembled view of the first embodiment of the thermal module of the present invention.
Figure 2C:
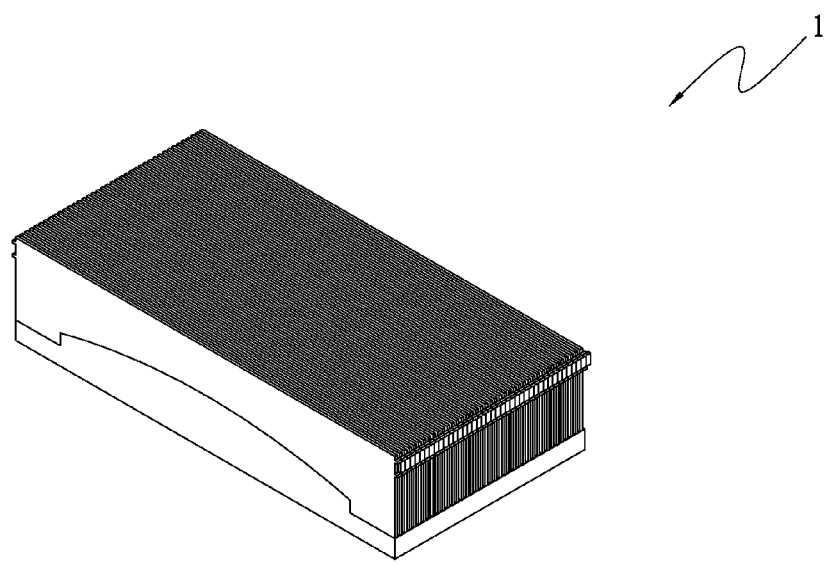
FIG. 2C is a perspective assembled view of the first embodiment of the thermal module of the present invention in another aspect.

Please now refer to FIGS. 2A and 2B. FIG. 2A is a perspective exploded view of a first embodiment of the thermal module of the present invention. FIG. 2B is a perspective assembled view of the first embodiment of the thermal module of the present invention. According to the first embodiment, the thermal module 1 made by means of the above manufacturing method includes a base seat 10 and a heat dissipation unit 11. The base seat 10 has a raised section 101 raised from a middle section of the base seat 10. The heat dissipation unit 11 includes multiple radiating fins 111 and a recess 1111 corresponding to the raised section 101. The recess 1111 is formed on one side of the heat dissipation unit 11, which side faces the base seat 10. The raised section 101 is connected to the recess 1111. The raised section 101 has a first side 1011, a second side 1012 and a third side 1013. Two ends of the second side 1012 are respectively connected with the first and third sides 1011, 1013. The second side 1012 can have a rectangular shape (as shown in FIG. 2B), an arched shape (as shown in FIG. 2C) or any other suitable geometric shape.

The first, second and third sides 1011, 1012, 1013 of the raised section 101 are tightly attached to the recess 1111 of the heat dissipation unit 11 to integrally connect the heat dissipation unit 11 with the base seat 10. This lowers the manufacturing cost and simplifies the manufacturing process.

Figure 3A:
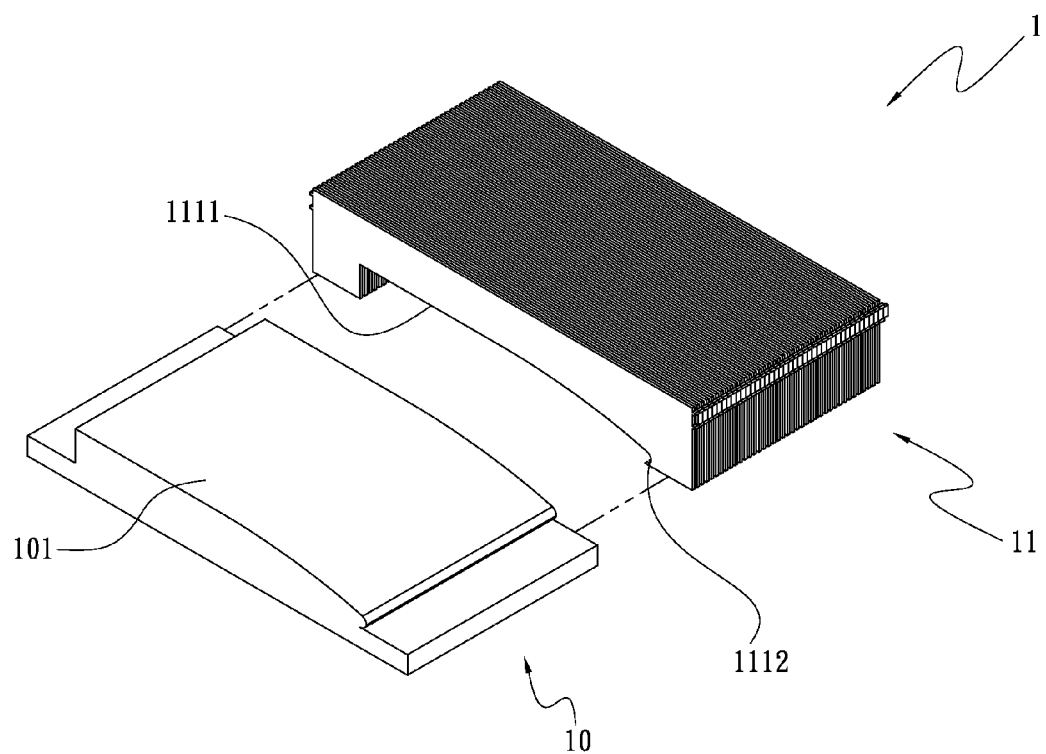
FIG. 3A is a perspective exploded view of a second embodiment of the thermal module of the present invention.
Figure 3B:
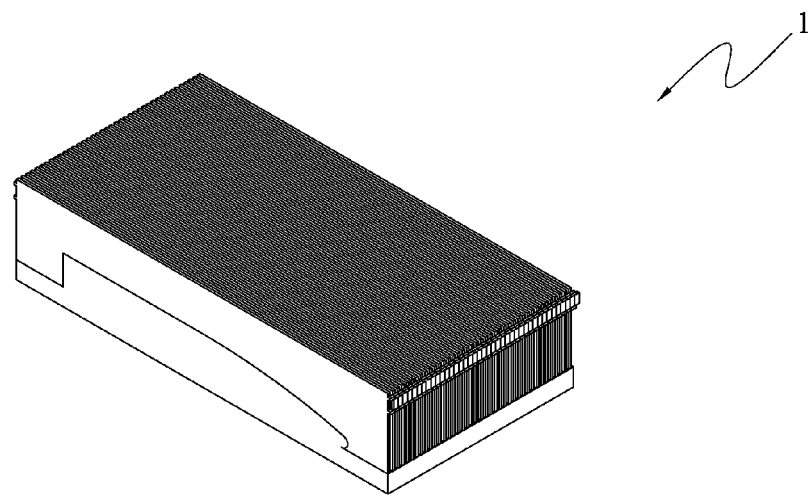
FIG. 3B is a perspective assembled view of the second embodiment of the thermal module of the present invention.
Figure 3C:
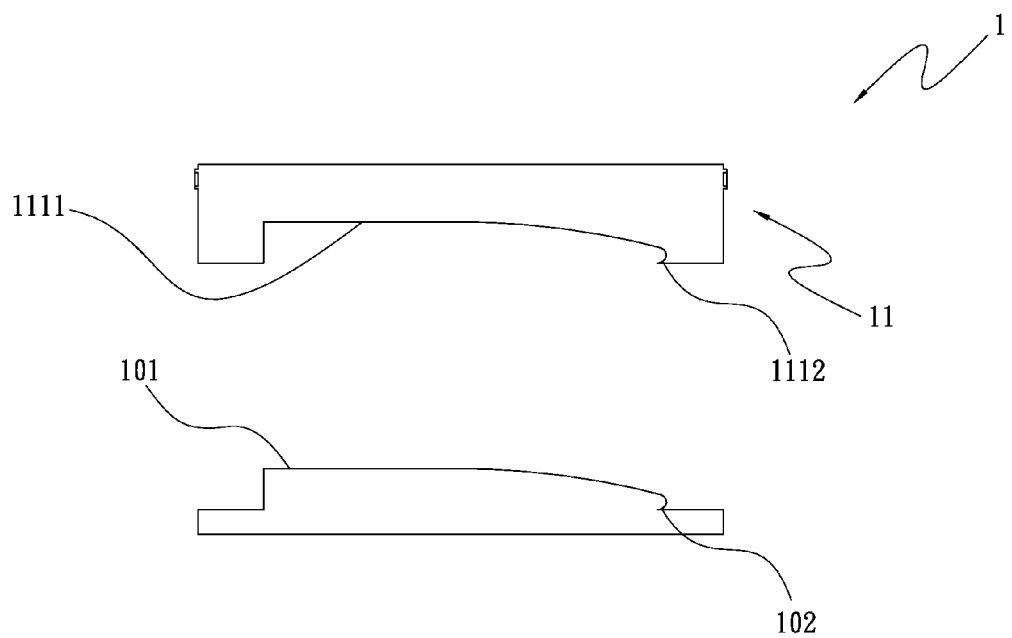
FIG. 3C is a plane view of the second embodiment of the thermal module of the present invention.

Please now refer to FIGS. 3A, 3B and 3C. FIG. 3A is a perspective exploded view of a second embodiment of the thermal module of the present invention. FIG. 3B is a perspective assembled view of the second embodiment of the thermal module of the present invention. FIG. 3C is a plane view of the second embodiment of the thermal module of the present invention. The second embodiment is partially identical to the first embodiment in component and relationship between the components and thus will not be repeatedly described hereinafter. The second embodiment is mainly different from the first embodiment in that an inner side of the recess 1111 of the heat dissipation unit 11 is formed with at least one protrusion 1112. At least one side of the raised section 101 of the base seat 10 is formed with a groove 102 corresponding to the protrusion 1112. The protrusion 1112 is connected to the groove 102 to tightly connect the base seat 10 with the heat dissipation unit 11.

Figure 4A:
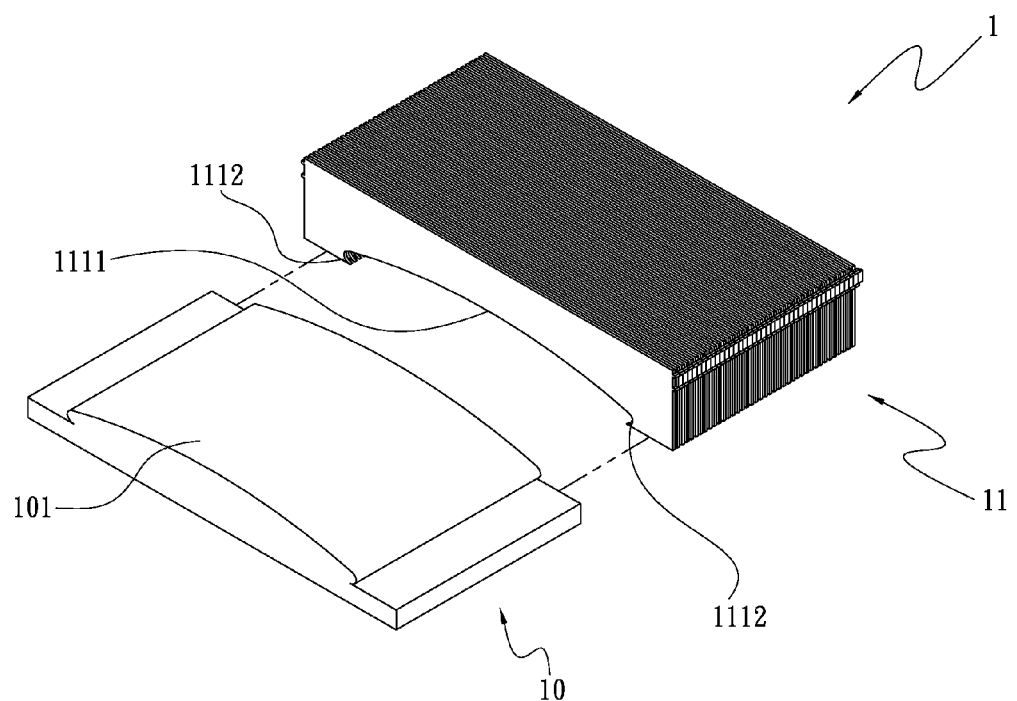
FIG. 4A is a perspective exploded view of a third embodiment of the thermal module of the present invention.
Figure 4B:
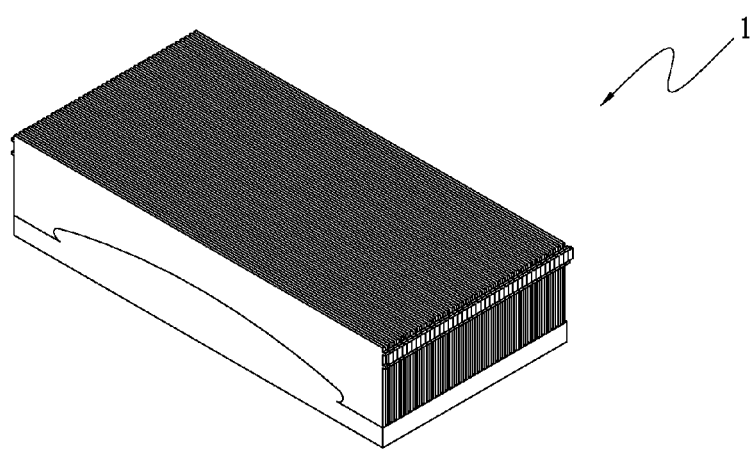
FIG. 4B is a perspective assembled view of the third embodiment of the thermal module of the present invention.
Figure 4C:
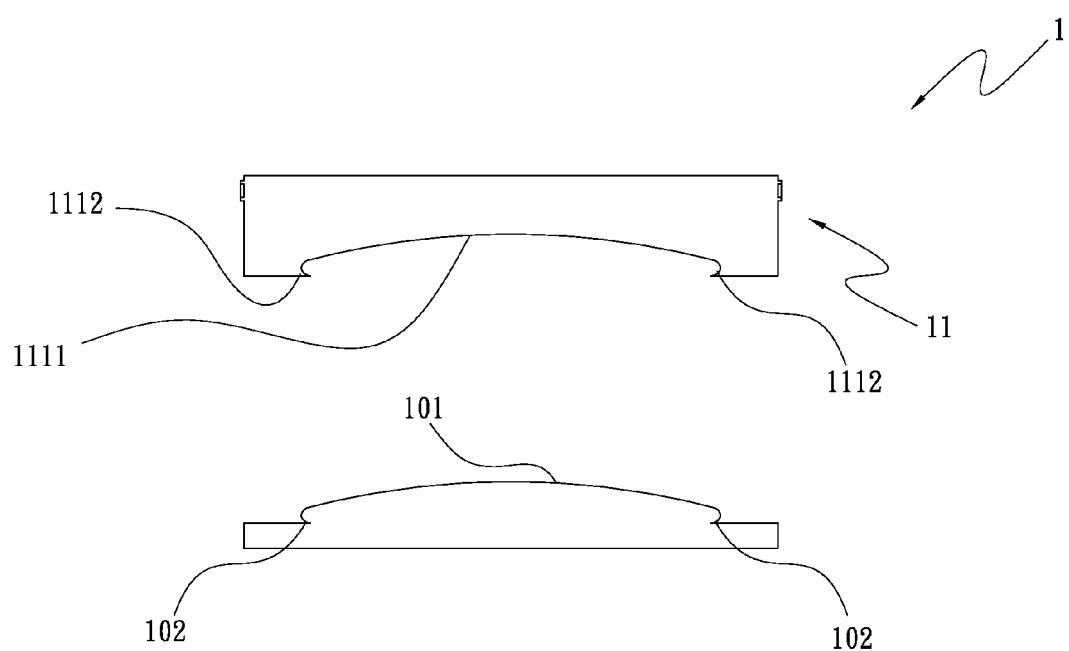
FIG. 4C is a plane view of the third embodiment of the thermal module of the present invention.

Please now refer to FIGS. 4A, 4B and 4C. FIG. 4A is a perspective exploded view of a third embodiment of the thermal module of the present invention. FIG. 4B is a perspective assembled view of the third embodiment of the thermal module of the present invention. FIG. 4C is a plane view of the third embodiment of the thermal module of the present invention. The third embodiment is partially identical to the first embodiment in component and relationship between the components and thus will not be repeatedly described hereinafter. The third embodiment is mainly different from the first embodiment in that two inner sides of the recess 1111 of the heat dissipation unit 11 are respectively formed with protrusions 1112. Two sides of the raised section 101 of the base seat 10 are formed with grooves 102 corresponding to the protrusions 1112. The protrusions 1112 are connected to the grooves 102 to tightly connect the base seat 10 with the heat dissipation unit 11.

In conclusion, in comparison with the conventional heat sink, the present invention has the following advantages:

1. The manufacturing cost is lowered.
2. The manufacturing process is simplified.

The present invention has been described with the above embodiments thereof and it is understood that many changes and modifications in the above embodiments can be carried out without departing from the scope and the spirit of the invention that is intended to be limited only by the appended claims.

What is claimed is:

1. A thermal module comprising:
    a base seat having a raised section raised from a middle section of the base seat having first and second extensions extending each outward of opposite sides of the middle raised section; and
    a separate heat dissipation unit including multiple radiating fins, a recess corresponding to the raised section of the base seat, the recess being formed in a middle section on one side of the heat dissipation unit partially surrounded on opposite sides by first and second exposed bottom portions of the multiple radiating fins, wherein the one side of the heat dissipation unit faces the base seat, the raised section being inserted in and connected to the recess;
    wherein an inner end of the recess is formed with at least one lateral protrusion extended toward an opposite end of the recess and at least one end of the raised section is formed with groove corresponding to the protrusion, the protrusion being inserted in and connected to the groove; and
    wherein the first and second extensions each having a contact surface in direct contact with one of the first and second exposed bottom portions of the multiple radiating fins.

2. The thermal module as claimed in claim 1, wherein the raised section has a first side, a second side and a third side, two ends of the second side being respectively connected with the first and third sides.

3. The thermal module as claimed in claim 2, wherein the second side has an arched shape.

4. The thermal module as claimed in claim 2, wherein the second side has a rectangular shape.

* * * * *